United States Patent
Li et al.

(10) Patent No.: US 9,859,094 B2
(45) Date of Patent: Jan. 2, 2018

(54) CHARGED PARTICLE BEAM APPARATUS AND IMAGE FORMING METHOD OF CHARGED PARTICLE BEAM APPARATUS

(71) Applicant: HITACHI HIGH-TECHNOLOGIES CORPORATION, Minato-ku, Tokyo (JP)

(72) Inventors: Wen Li, Tokyo (JP); Kazuki Ikeda, Tokyo (JP); Takuma Nishimoto, Tokyo (JP); Hiroyuki Takahashi, Tokyo (JP); Hajime Kawano, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/365,545

(22) Filed: Nov. 30, 2016

(65) Prior Publication Data

US 2017/0207061 A1    Jul. 20, 2017

(30) Foreign Application Priority Data

Jan. 20, 2016  (JP) ................. 2016-008593

(51) Int. Cl.
*H01J 37/22*  (2006.01)
*H01J 37/244*  (2006.01)
*H01J 37/28*  (2006.01)

(52) U.S. Cl.
CPC .......... *H01J 37/222* (2013.01); *H01J 37/244* (2013.01); *H01J 37/28* (2013.01); *H01J 2237/2448* (2013.01)

(58) Field of Classification Search
CPC .............. H01J 37/222; H01J 49/025

USPC ................. 250/281, 299, 307, 310
See application file for complete search history.

(56) References Cited

U.S. PATENT DOCUMENTS

| | | | | |
|---|---|---|---|---|
| 2,576,257 A | * | 11/1951 | Lange | G01R 27/2688 324/653 |
| 3,898,456 A | * | 8/1975 | Dietz | G01T 1/29 250/281 |
| 9,222,890 B2 | * | 12/2015 | Kohara | G01N 21/69 |
| 2015/0378243 A1 | * | 12/2015 | Kippelen | G02F 1/0126 359/244 |
| 2017/0207061 A1 | * | 7/2017 | Li | H01J 37/222 |
| 2017/0269257 A1 | * | 9/2017 | Scoullar | G01V 5/0041 |

FOREIGN PATENT DOCUMENTS

JP    2011-175811 A    9/2011

* cited by examiner

*Primary Examiner* — David A Vanore
(74) *Attorney, Agent, or Firm* — Miles & Stockbridge P.C.

(57) ABSTRACT

In an image forming method of charged particle beam apparatus for scanning a sample by irradiating the sample with a converged charged particle beam and detecting secondary charged particles generated from the sample by a detection unit, receiving and processing an output signal from the detection unit, and receiving the processed signal and forming an image of the sample, receiving and processing the output signal are performed by analogically processing the output signal and by performing pulse-count processing on the output signal, and pulse-count processing is performed by removing a ringing pulse in the output signal and counting pulses in the signal from which the ringing pulse has been removed.

10 Claims, 8 Drawing Sheets

F I G. 6
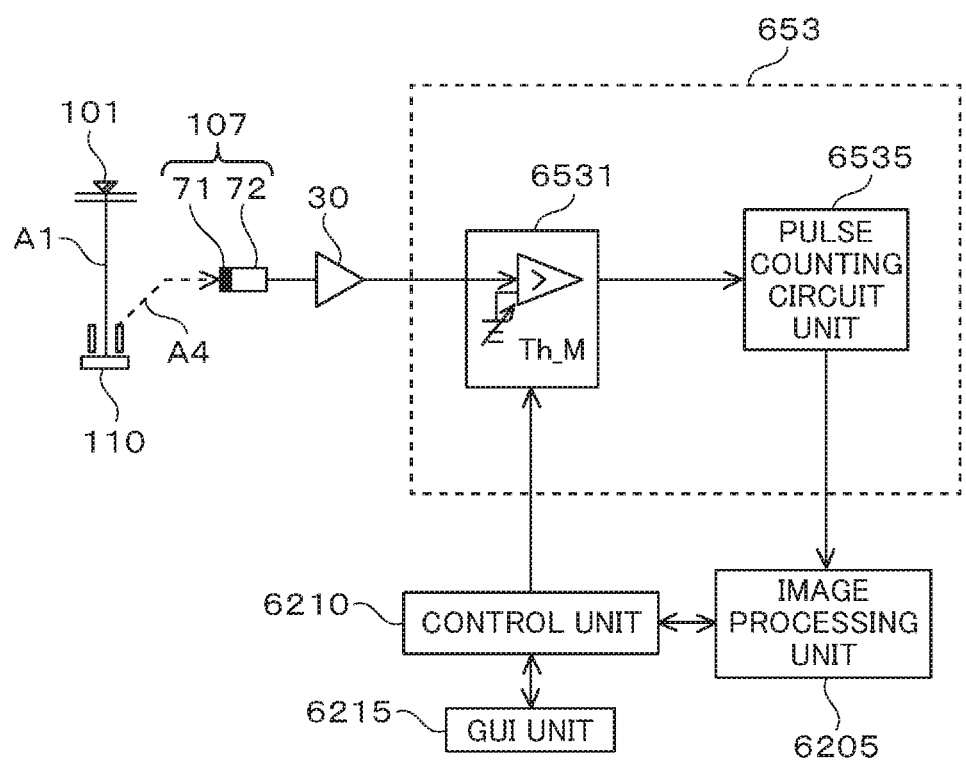

CHARGED PARTICLE BEAM APPARATUS AND IMAGE FORMING METHOD OF CHARGED PARTICLE BEAM APPARATUS

BACKGROUND

The present invention relates to a charged particle beam apparatus adapted to measure, observe and/or inspect a fine pattern formed on a sample and an image forming method used in the charged particle beam apparatus.

In a charged particle beam measurement apparatus which is represented by a scanning electron microscope, a scintillator and a photomultiplier tube are used in combination in order to detect secondary electrons and back scattered electrons which are generated when the sample has been irradiated with electron beams. When light emitted from the scintillator is incident upon the photomultiplier tube, a photoelectron is emitted from a photoelectric surface and the photoelectron is multiplied by the photomultiplier tube. Here, since a pulse interval between pulses of a signal output from the photomultiplier tube is narrow in a region where the incident light is intense, the signal exhibits an analog waveform that the pulses are mutually superimposed. However, when the light becomes faint, the signal exhibits a pulsed output waveform that the pulses are individually discrete.

As related art pertaining to a system of detecting the analog waveform and the pulsed output waveform as described above, there is a technology described in Japanese Patent Application Laid-Open No. 2011-175811 (Patent Literature 1).

In Japanese Patent Application Laid-Open No. 2011-175811 (Patent Literature 1), the following content is described. That is, there is described a charged particle beam apparatus which includes a decision unit which decides whether an output signal is an output signal which is in a state where one charged particle is incident upon a detector concerned or an output signal which is in a state where a plurality of the charged particles are incident upon the detector concerned, and an arithmetic operation unit which performs image formation by signal processing using a pulse counting method when it has been decided that the output signal is the output signal which is in the state where one charged particle is incident upon the detector concerned and performs image formation by signal processing using an analog method when it has been decided that the output signal is the output signal which is in the state where the plurality of charged particles are incident upon the detector concerned.

SUMMARY

In a semiconductor manufacturing process, refinement of a circuit pattern to be formed on a semiconductor substrate (a wafer) is rapidly progressed and importance of process monitoring that whether those patterns are formed as designed is monitored is more and more increased. For example, measurement and inspection of the circuit pattern and so forth on each wafer are performed at completion of each manufacturing process in order to detect early or in advance occurrence of abnormality and failures (defects) in the semiconductor manufacturing process.

When performing the above-mentioned measurement, observation and/or inspection, in a measurement-inspection apparatus such as an electron microscope device (Scanning Electron Microscope: SEM) using a scanning electron beam system and a measurement-inspection method corresponding to the above-mentioned measurement-inspection apparatus, a target wafer (a sample) is irradiated with electron beams (electron rays) while scanning the target wafer and energy of secondary electrons, back scattered electrons and so forth which are generated from the target wafer so irradiated with the electron beams is detected. Then, images (measurement images and inspection images) are generated by performing signal processing, image processing and so forth on the basis of detection of the energy and thereby measurement, observation and/or inspection is/are performed on the basis of the images concerned.

For example, in an apparatus (an inspection apparatus and an inspection function) which performs inspection of a defect in the circuit pattern, images of the same circuit pattern are mutually compared by using the inspection images and a part where a difference between the images is large is decided and detected as the defect.

In addition, in an apparatus (a measurement apparatus and a measurement function) which performs measurement on the circuit pattern, since a generation amount of the secondary electrons, the back scattered electrons and so forth is changed depending on unevenness (a surface form) of the sample, a change in surface form of the sample and so forth are suppressed by performing evaluation processing of a signal of the secondary electron and so forth. In particular, dimension values and so forth of the circuit pattern are measured by estimating the position of an edge in the image of the circuit pattern concerned by utilizing a situation that the number of secondary electron signals and so forth is suddenly increased or decreased on the edge part of the circuit pattern. Then, whether the circuit pattern concerned is to be processed is evaluated on the basis of a result of the measurement.

Further, in an apparatus (a review apparatus) which observes in detail the defect detected by another inspection apparatus, the position of the defect is detected using a secondary electron image of low magnification on the basis of the position coordinates of the defect detected by another inspection apparatus, then an enlarged image of the defect is taken using a secondary electron image of high magnification, the defect is observed by using this enlarged image and the defect is classified by extracting a feature amount of the defect on the image from the enlarged image.

In the following, an electron beam scanning system in a measurement-inspection apparatus such as an SEM and so forth of related art will be described. For example, normal scanning of electron beams by a CD-SEM (Critical Dimension Scanning Electron Microscope: a length measurement SEM) is called TV (Tele-Vision) scanning, raster scanning or the like. In addition, scanning which has been n-folded in scan rate with the TV scanning being defined as a reference is called n-fold scanning or the like.

The existing raster scanning system or TV scanning system has such a drawback that a difference occurs in charge amount of the sample in accordance with a scanning direction and the scan rate of the electron beams, the shape of the pattern formed on the sample and so forth. The difference becomes more noticeable as the pattern of a measurement or inspection object is made finer. Due to this difference in charge amount of the sample, in an image obtained by scanning the fine pattern of the measurement or inspection object using the electron beams and detecting the secondary electrons, such a drawback arises that accuracy in observation, that is, the accuracy in measurement and inspection of a state of the sample surface is reduced or the observation, that is, the measurement and the inspection become difficult because image contrast is lowered and/or the edge of the circuit pattern disappears and so forth.

In regard to the above-mentioned reduction in measurement and inspection accuracy, it is effective to shorten an electron beam irradiation time per unit area, that is, to reduce a density of radiated electric charges and to reduce or make appropriate the charge amount of the sample. For this purpose, it is effective to increase, for example, to n-fold the electron beam irradiation scan rate, that is, to realize high-speed scanning. However, there is such a drawback that frequency of generation of the secondary electrons, the back scattered electrons and so forth generated from the sample is reduced, that is, detection frequency of the secondary electrons and so forth is lowered with a reduction in density of radiated electric charges caused by high-speed scanning of the electron beams.

As detection systems for the secondary electrons, the back scattered electrons and so forth, an analog detection system and a pulse counting system are available.

The analog detection system is a system of imaging the signal intensity of the secondary electron using an integrated value obtained in units of pixels. A technique of periodically reading output values for a signal waveform and setting their peak values as pixel data is considered to be favorable. As an output value reading method, in general, sampling is performed by using an analog-to-digital converter (hereinafter, denoted as ADC). Since a difference in gradation value obtained in units of pixels is generated by integrating and averaging amplitude information of the sampled signal obtained in units of pixels, brightness change information of the image is obtained.

However, when the fine pattern is scanned with the electron beams from above at a high speed, the frequency of generation of the secondary electrons from the sample is lowered and a narrow-width and discrete pulse signal is output from a detection system. Therefore, such a drawback arises that this pulse signal leaks to background noise of the detection system in case of the analog detection system and a signal-to-noise ratio (the S/N ratio) of a detected signal is reduced.

In contrast, the pulse counting system is a system of performing wave height discrimination on the discrete pulse signal which is output from a secondary electron detection system when the fine pattern has been scanned with the electron beams from above at the high speed and counting the number of pulse signals of values which exceed a certain threshold value. The pulse counting system allows detection of the signal at a high signal-to-noise ratio (the S/N ratio) in comparison with the analog detection system, coping with a reduction in generation frequency of the secondary electrons and so forth which are generated when the fine pattern has been scanned with the electron beams from above at the high speed and is effective for detection of the secondary electrons and so forth of low generation frequency.

However, in order to realize high resolution in pulse signal discrimination, it is requested to attain speeding-up and bandwidth widening of a photomultiplier and a preamplifier circuit so as to make the width of the pulse signal as narrow as possible. The photomultiplier and a detection circuit induce a ringing phenomenon by making the width of the pulse signal narrow and a succeeding pulse of a value exceeding the threshold value is generated after generation of a true signal pulse. Presence of this ringing pulse obstructs highly efficient detection of a low-amplitude signal.

Such a phenomenon also occurs when observing the bottom of a deep-hole pattern. That is, when observing the bottom of the deep-hole pattern, a ratio of the secondary electrons which reach the detector to the secondary electrons generated on the bottom of the deep-hole pattern is reduced and detection by the pulse counting system is performed in order to improve visibility of the bottom of the deep-hole pattern. However, also in this case, presence of the ringing pulse obstructs highly efficient detection of the low-amplitude signal.

Accordingly, the present invention has been made in view of the above-mentioned drawbacks and aims to provide, in a charged particle beam apparatus which inspects and/or measures a fine pattern, the charged particle beam apparatus and an image forming method of the charged particle beam apparatus making it possible to detect a pulse signal with high accuracy in order to realize to improve resolution by using the pulse counting system and to improve visibility of the bottom of the deep-hole pattern.

In order to eliminate the above-mentioned drawbacks, according to one embodiment of the present invention, there is provided a charged particle beam apparatus including a charged particle optical system which scans a sample by irradiating the sample with a converged charged particle beam, a secondary charged particle detection unit which detects secondary charged particles generated from the sample which has been scanned by being irradiated with the converged charged particle beam by the charged particle optical system, a secondary electronic signal detection unit which receives and processes an output signal from the secondary charged particle detection unit which has detected the secondary charged particles by a detection unit included therein, an image processing unit which receives the signal processed by the secondary electronic signal detection unit and generates an image of the sample, and a control unit which controls operations of the charged particle optical system, the secondary charged particle detection unit, the secondary electronic signal detection unit and the image processing unit, in which the secondary electronic signal detection unit includes an analog processing unit which analogically processes the output signal received from the secondary charged particle detection unit and a pulse-count processing unit which counts and processes pulses of the output signal received from the secondary charged particle detection unit, and the pulse-count processing unit includes a ringing pulse removal unit which removes a ringing pulse included in the output signal received from the secondary charged particle detection unit and a pulse-counting unit which counts the pulses of the signal from which the ringing pulse has been removed by the ringing pulse removal unit.

In addition, in order to eliminate the above-mentioned drawbacks, according to another embodiment of the present invention, there is provided an image forming method of charged particle beam apparatus including scanning a sample by irradiating the sample with a converged charged particle beam and thereby detecting secondary charged particles generated from the sample by a detection unit, receiving and processing an output signal from the detection unit which has detected the secondary charged particles, and receiving the processed signal and forming an image of the sample, in which receiving and processing the output signal from the detection unit are performed by analogically processing the output signal received from the detection unit by an analog processing unit and by performing pulse-count processing of processing the output signal received from the detection unit by counting pulses in the output signal, and performing the pulse-count processing means to perform pulse-count processing by removing a ringing pulse included in the output signal received from the detection unit and counting pulses in the signal from which the ringing pulse has been removed.

According to a representative embodiment of the present invention, it is possible to improve the detection accuracy of a high-speed and weak pulse signal and it is also possible to improve the resolution and the visibility of the deep-groove and deep-hole of the inspection-measurement apparatus which inspects and/or measures the fine pattern.

These features and advantages of the invention will be apparent from the following more particular description of preferred embodiments of the invention, as illustrated in the accompanying drawing.

BRIEF DESCRIPTION OF THE DRAWINGS

FIG. 6 is a block diagram illustrating one example of a configuration of a pulse-count processing unit of a measurement-observation-inspection apparatus using a scanning electron microscope of related art;

DESCRIPTION OF THE PREFERRED EMBODIMENTS

The present invention has been made so as to form images from secondary electron and back scattered electron signals of a sample acquired by using a scanning electron microscope in an analog integration system and a pulse counting system, to composite the formed images together and thereby to obtain an image in which a boundary region of a pattern formed on the sample is clear. In particular, the present invention relates to a configuration of a unit which discriminates, removes and processes a ringing pulse and a method for processing the ringing pulse in the pulse counting system on the basis of which the image is formed.

Figure 7:
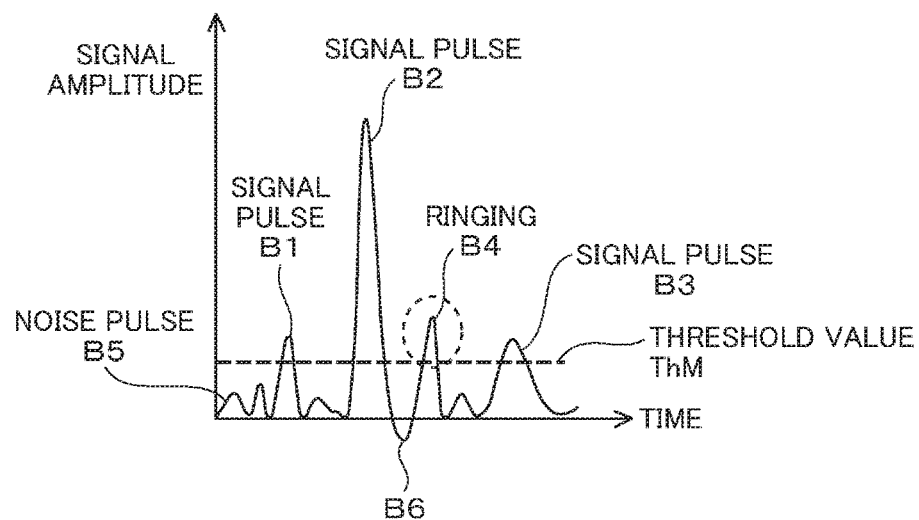
FIG. 7 is a waveform diagram illustrating one example of waveforms of a signal pulse and a ringing pulse of the measurement-observation-inspection apparatus using the scanning electron microscope.

Generation of the ringing pulse is a matter which would occur unavoidably with speeding-up and bandwidth widening of a detection circuit including a photomultiplier. Although there exists a method for increasing a threshold value TnM as illustrated in FIG. 7 in order to delete the ringing pulse, this method has such a drawback that detection of low-amplitude signal pulses B1 and B3 is difficult.

A phenomenon that the ringing pulse exhibits will be described with reference to FIG. 6, FIG. 7 and FIG. 8. A ringing pulse B4 appears after a signal pulse B2 has appeared at predetermined time intervals t1 and t2 depending on characteristics of a detector 107 and a preamplifier circuit 30 and a connection characteristic between the detector 107 and the preamplifier 30. An amplitude value of the ringing pulse B4 is proportional to an amplitude value of the signal pulse B2. In addition to the above, the ringing pulse has one important feature. An undershoot pulse B6 is present between the ringing pulse B4 and the signal pulse B2 which causes the ringing pulse B4. In addition, a minimum value of the undershoot pulse B6 becomes not more than a lowest level (in general, zero levels) of the signal pulse.

That is, the present invention relates to a charged particle beam apparatus using a technique for discriminating and removing the ringing pulse by utilizing the above-mentioned characteristics and mutually different characteristics of the ringing pulse and the signal pulse and a method for forming an image by using the charged particle beam apparatus.

In the following, preferred embodiments of the present invention will be described in detail with reference to the drawings. Incidentally, in description of the embodiments, the same numerals are assigned to the same parts in principle in all drawings and repetitive description thereof is omitted. In the following, a measurement-inspection apparatus and a measurement-inspection method include a case of performing only measurement, a case of performing only inspection and a case of performing both of measurement and inspection.

First Embodiment

A measurement-inspection apparatus of a scanning electron beam system according to the first embodiment and a measurement-inspection method using the measurement-inspection apparatus will be described in comparison with related art with reference to FIG. 1, FIG. 2, FIG. 6, FIG. 7 and FIG. 8.

[Measurement-Inspection Apparatus]

Figure 2:
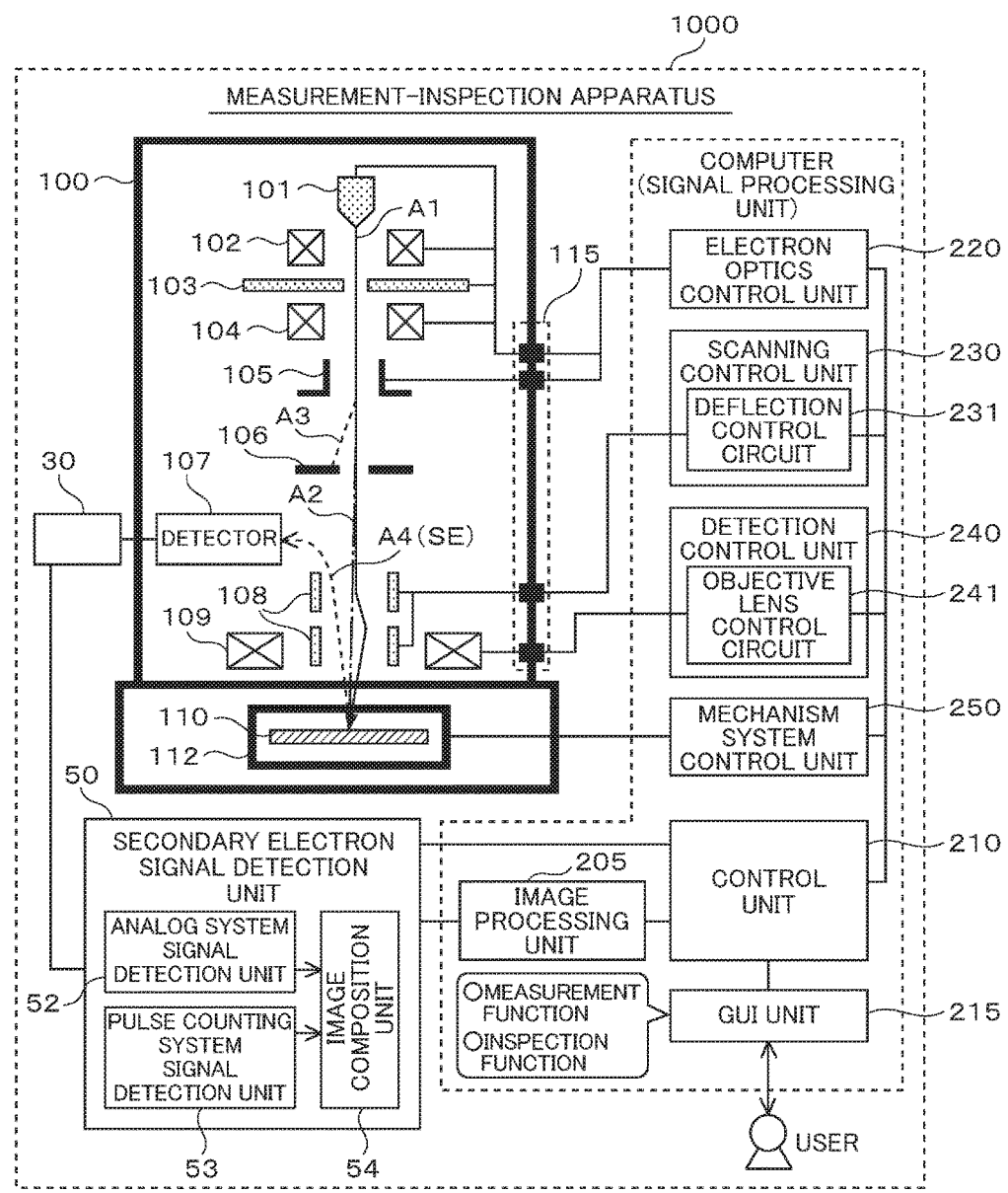
FIG. 2 is a block diagram illustrating one example of a schematic configuration of the measurement-observation-inspection apparatus using the scanning electron microscope according to the first embodiment of the present invention.

FIG. 2 illustrates one example of a configuration of the entire system including a measurement-inspection apparatus according to a first embodiment. The measurement-inspection apparatus 1000 according to the first embodiment is an application example to an electron microscope apparatus (SEM) of the scanning electron beam system having a function of performing automatic measurement and inspection using a semiconductor wafer as a sample 110. The measurement-inspection apparatus 1000 includes a measurement function of measuring dimension values of a pattern formed on a surface of the sample 110, and an inspection function of detecting states of abnormality, defects and so forth which would occur in the pattern.

The measurement-inspection apparatus 1000 is configured by a mechanism system which includes a column 100 which is the main body, a sample stage 112, that is, a stage on which the sample 110 or the like is to be placed and so forth and a signal processing system which includes a computer 200, a secondary electron signal detection unit 50 and so forth.

An electro-optical system of the SEM system, the detector 107 and so forth are built in the column 100. The secondary electron signal detection unit 50 is connected to the detector 107 of the column 100 via the preamplifier circuit 30 and the secondary electron signal detection unit 50 is connected to the computer 200. The preamplifier circuit 30 and the secondary electron signal detection unit 50 are configured by, for example, electronic circuit boards and so forth. For example, the boards which configure the preamplifier circuit 30 and so forth may be connected to the vicinity (inside or outside) of a side face of the column 100.

Figure 1:
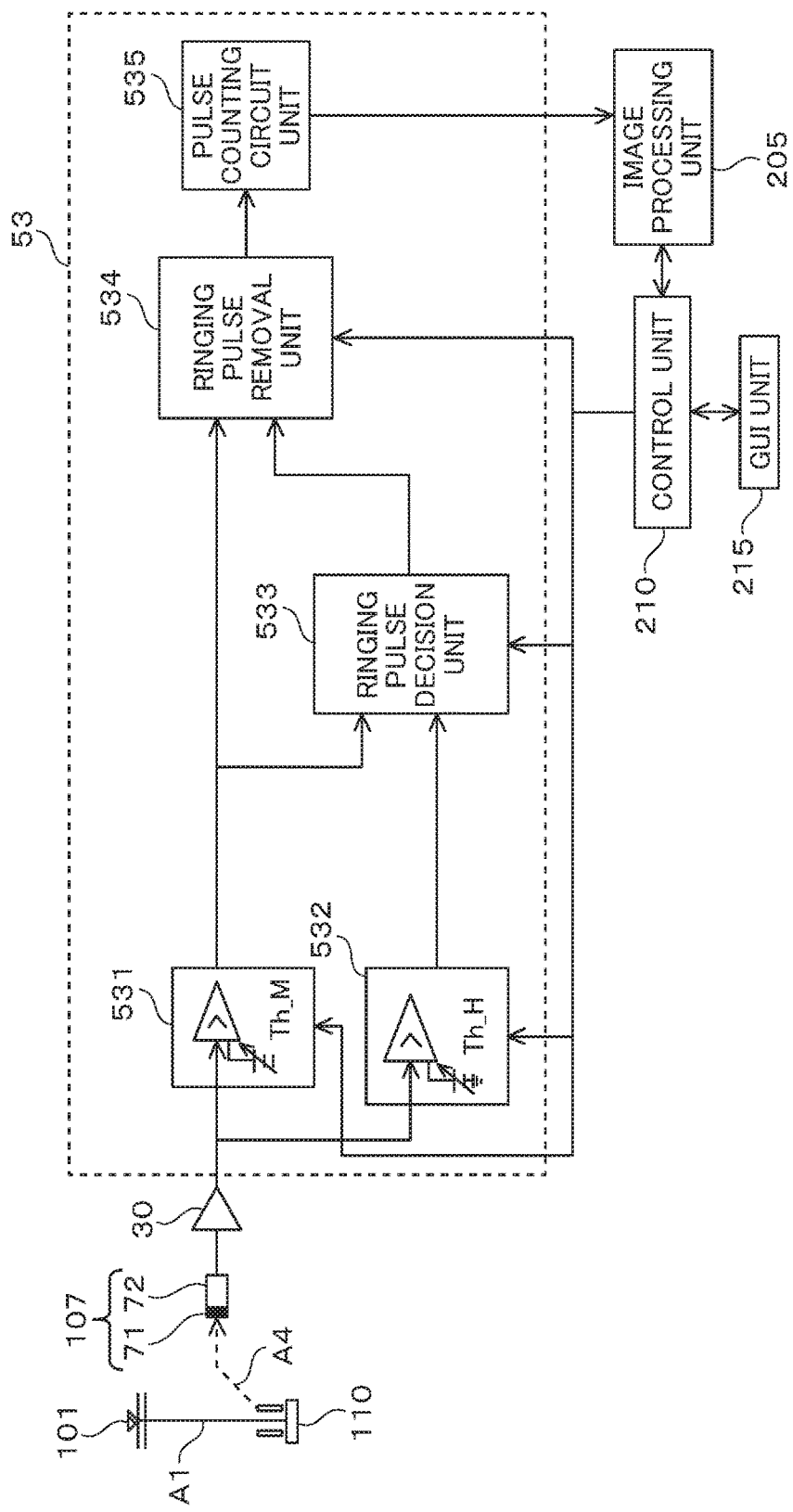
FIG. 1 is a block diagram illustrating one example of a configuration of a pulse-count processing unit of a measurement-observation-inspection apparatus using a scanning electron microscope according to a first embodiment of the present invention.

It is possible to bring the inside of the column 100 into a vacuum state by evacuating the inside by a not illustrated vacuum pump for evacuation. As elements for configuring the electro-optical system and so forth arranged in the column 100, an electron gun 101, a first condenser lens 102, an aperture 103, a second condenser lens 104, a blanking control electrode 105, an aperture 106, a deflector 108, an objective lens 109 and so forth are included. In addition, the detector 107 and so forth which are the elements for configuring a detection system are included in the column 100. As illustrated in FIG. 1, the detector 107 includes a scintillator 71 and a photomultiplier tube 72.

The electron gun 101 emits a beam A1 which is a primary electron beam. The first condenser lens 102 is a condensing lens and the beam A1 which has been emitted from the electron gun 101 passes through the first condenser lens 102. The second condenser lens 104 is a condensing lens and the beam A1 the diameter of which has been reduced by the aperture 103 passes through the second condenser lens 104. The beam A1 which has been emitted from the electron gun 101 is condensed through the first condenser lens 102, the aperture 103, and the second condenser lens 104.

The blanking control electrode 105 is used when blanking control for on-off controlling interruption of beam irradiation is performed. In general, in an off-state of interruption, the beam passes between the blanking control electrodes 105 without being interrupted and passes through the aperture 106 as indicated by A2. In an on-state of interruption, the beam is bent between the blanking control electrodes 105 and is interrupted not passing through the aperture 106 as indicated by A3.

The beam A2 which has passed through the aperture 106 is deflection controlled through the deflector 108. That is, the beam A2 is subjected to scanning control including deflection control, passes through the objective lens 109 and so forth and is radiated to the sample 110 on the sample stage 112 while scanning the sample 110. Some of secondary charged particles A4 of a secondary electron signal (SE), a back scattered electron signal (BSE) and so forth which are generated from the sample owing to irradiation of the sample 110 with the electron beam A2 are incident upon the detector 107 and are detected as an electric signal and an analog signal (also called a detection signal, a pulse signal and so forth).

The analog signal which has been output from the detector 107 which has detected the secondary charged particles A4 of the secondary electron signal (SE), the back scattered electron signal (BSE) and so forth is subjected to current (I)-to-voltage (V) conversion by the preamplifier circuit 30 and is input into the secondary electron signal detection unit 50. In the secondary electron signal detection unit 50, a path for the signal is divided into two paths, an analog image signal obtained by the analog system via an analog system signal detection unit 52 and a pulse image signal obtained by the pulse-counting system via a pulse counting system signal detection unit 53 are subjected to composite operation in units of pixels or in units of blocks by an image composition unit 54. The image signal so composited by the image composition unit 54 is input into an image processing unit 205.

In the image processing unit 205, a two-dimensional measurement image or inspection image is generated by performing image processing according to measurement or inspection using the digital signal or sampling data output from the secondary electron signal detection unit 50. The image processing unit 205 generates the measurement image and performs calculation and so forth of the dimension values of the pattern in the image concerned in case of the measurement function. In addition, the image processing unit 205 generates the inspection image and performs processing and so froth for detecting and deciding the defects and so forth in the image concerned in case of the inspection function.

A control unit 210 acquires data information including the image concerned, stores the data information into a memory and so forth (not illustrated) in the computer 200 and thereby manages the data information. In addition, a GUI (Graphical User Interface) screen including the image concerned and the data information is generated and displayed to a user via processing performed by a GUI unit 215 under the direction of the control unit 210. For example, in case of the measurement function, dimensions of the circuit pattern and so forth are measured on the basis of the information in the measurement image. In case of the inspection function, the abnormality, the defects and so forth are detected on the basis of the information in the inspection image.

The computer 200 may be implemented by, for example, a PC (Personal Computer) and so forth. The computer 200, the secondary electron signal detection unit 50 and so forth are contained in, for example, a control rack. In addition, the column 100, the electronic circuit board, the computer 200 and so forth are connected together via a cable and so forth. Incidentally, a form that the computer 200 is integrated with other circuit boards (the preamplifier circuit 30, the secondary electron signal detection unit 50 and so forth) and so forth are also possible.

The computer 200 includes the image processing unit 205, the control unit 210, the GUI unit 215, an electro-optical control unit 220, a scanning control unit 230, a detection control unit 240, a mechanism system control unit 250 and so forth. Each of these units is implemented by, for example, software program processing by well-known elements such as a processor, a memory and so forth, a dedicated processing circuit, a combination of the software program processing with the dedicated processing circuit and so forth. Incidentally, although the computer 200, the control unit 210 and so forth each has both of the measurement function and the inspection function, a form having one of the measurement function and the inspection function is also possible.

The control unit 210 performs processing for controlling the entire or each unit of the measurement-inspection apparatus 1000 and processing for measurement and/or inspection in accordance with instructions that the user has input through the GUI screen and so forth of the GUI unit 215. In execution of measurement and/or inspection, the control unit 210 acquires the data information including detected and generated images via the secondary electron signal detection unit 50 and the image processing unit 205 and causes the GUI unit 215 to display the data information on the GUI screen. The control unit 210 stores the data information including the above-mentioned images, setting information for measurement and/or inspection and so forth in storage units (not illustrated) such as the memory, a storage and so forth and thereby manages these pieces of information.

The GUI unit 215 performs processing for providing the GUI screen to the user who will perform measurement and/or inspection. The user is allowed to selectively execute the measurement function and/or the inspection function on the GUI screen in relation to work for measurement and/or inspection and is allowed to issue various operating instructions and to browse the data information and so forth. The GUI unit 215 provides a screen through which conditions for measurement and/or inspection are input and set, a screen on which results of measurement and/or inspection are displayed in the form of a two-dimensional image and so forth to the user. The GUI unit 215 includes input/output devices such as a keyboard, a mouse, a display and so forth, a communication interface unit and so forth. Selective execution of the measurement function and/or the inspection function is possible.

The electro-optical control unit 220 has a configuration including a blanking control circuit and so forth and controls irradiation of the sample 110 with the electron beams (A1, A2, and A3) by driving the electro-optical system including the electron gun 101, the electro-optical lenses (the condenser lenses) (102 and 104), the aperture 103, the blanking control electrode 105 and so forth in the column in accordance with control by the control unit 210. That is, the electro-optical control unit 220 controls the electro-optical system which includes the electro-optical lenses (102 and 104) and so forth in the column 100.

The scanning control unit 230 has a configuration including a deflection control unit 231 and controls scanning of the sample 110 by irradiation of the sample 110 with the electron beam (A2) by driving the units including the deflector 108 in the column 100 in accordance with control by the control unit 210. In addition, the scanning control unit 230 realizes a scanning control function which corresponds to a scanning mode, which is described in later, at each scan rate and controls scanning in accordance with a designated scan rate. The deflection control circuit 231 controls scanning by deflection of the electron beam A2 by applying a deflection control signal to the deflector 108.

The detection control unit 240 has a configuration including an objective lens control circuit 241 and so forth and controls detection of the secondary charged particles A4 of the secondary electron signal (SE), the back scattered electron signal (BSE) and so forth generated from the sample 110 using the detector 107 by driving the units including the objective lens 109 in the column 100 in accordance with control by the control unit 210. The objective lens control circuit 241 controls detection of the secondary charged particles A4 such as the secondary electron signal (SE) and the back scattered electron signal (BSE) generated by irradiation of the sample 110 with the electron beam A2 by applying an objective lens control signal to the objective lens 109.

The mechanism system control unit 250 controls the operation of the mechanism system such as the sample stage 112 and so forth by applying a control signal to the mechanism system such as the sample stage 112 and so forth in accordance with control by the control unit 210. For example, the mechanism system control unit 250 controls movement of the sample stage 112 in X and Y directions conforming to information on an observed position of the sample 110 placed on the sample stage 112.

115 denotes a driver circuit and terminals thereof used when driving and controlling a corresponding electrode and so forth from each of the above-mentioned control units (the electro-optical control unit 220, the scanning control unit 230, the detection control unit 240 and so forth).

Then, details of the pulse-count processing unit 53 (that is, the pulse counting system signal detection unit) included in the secondary electron signal control unit 50 are illustrated in FIG. 1.

The analog signal which is output from the detector 107 upon which the secondary charged particles A4 of the secondary electron signal (SE), the back scattered electron signal (BES) and so forth have been incident is subjected to current (I)-to-voltage (V) conversion by the preamplifier circuit 30 and is input into the pulse-count processing unit 53.

FIG. 7 is a conceptual diagram illustrating one example of a waveform of a signal input into the pulse-count processing unit 53. In order to realize high resolution in pulse signal discrimination, it is requested to attain speeding-up and expansion of bandwidth of the photomultiplier which configures the detector 107 and the preamplifier circuit 30 such that the width of the pulse signal becomes as narrow as possible.

However, speeding-up and expansion of bandwidth of the photomultiplier which configures the detector 107 and the preamplifier circuit 30 lead to occurrence of a ringing phenomenon in the photomultiplier and a detection circuit and a ringing pulse B4 of a value exceeding a threshold value ThM is generated in addition to true signal pulses B1, B2 and B3, as illustrated in FIG. 7. When the ringing pulse B4 is misrecognized and counted by a pulse counting circuit unit 535 located at a subsequent stage as a signal pulse, signal detection accuracy is reduced.

In order to prevent misrecognition of the ringing pulse B4 as the signal pulse, the pulse-count processing unit 53 according to the first embodiment illustrated in FIG. 1 includes a primary signal pulse detection part 531 which extracts a candidate for the true signal pulse from the signal input from the preamplifier circuit 30, an undershoot detection unit 532 which detects an undershoot pulse from the signal input from the preamplifier circuit 30, a ringing pulse decision unit 533 which receives the signals from the primary signal pulse detection unit 531 and the undershoot detection unit 532 and decides the ringing pulse, a ringing pulse removal unit 534 which removes the ringing pulse which has been decided by the ringing pulse decision unit 533 from within the signal output from the primary signal pulse detection unit 531, the pulse counting circuit unit 535 which counts the number of the pulses included in the signal from which the ringing pulse has been removed by the ringing pulse removal unit 534, and an output from the pulse counting circuit unit 535 is sent to the image processing unit 205.

Next, the operation of the pulse-count processing unit 53 will be described.

The signal output from the preamplifier circuit 30 is input into the primary signal pulse detection unit 531. In the input signal, a signal pulse of a value which is larger than the threshold value ThM when compared with the threshold value ThM is discriminated as a primary signal pulse which is the candidate for the true signal pulse and a result of discrimination is output from the primary signal pulse detection unit 531. The signal which has been input from the preamplifier circuit 30 is input into the undershoot detection unit 532 in parallel with the above-mentioned operation.

In the undershoot detection unit 532, a signal pulse of a value which is smaller than a threshold value ThL which has been set lower than a minimum value of a signal including random noise in comparison with the threshold value ThL is decided as the undershoot pulse and a result of the decision is output from the undershoot detection unit 532.

The output from the primary signal pulse detection unit 531 and the output signal from the undershoot detection unit 532 are input into the ringing pulse decision unit 533. In the ringing pulse decision part 533, when there exist two primary signal pulses B2 and B4 which are continuously generated with an undershoot pulse B6 being interposed as illustrated in FIG. 7, the primary signal pulse B4 which comes after the undershoot pulse B6 is discriminated as the ringing pulse. Information on this ringing pulse is sent to the ringing pulse removal unit 534.

In the ringing pulse removal unit 534, the signal pulse which has been decided as the ringing pulse by the ringing pulse decision part 533 is removed from the signal output from the primary signal pulse detection unit 531. The pulse signal which has been output from the ringing pulse removal unit 534 and from which the ringing pulse has been removed is input into the pulse counting circuit unit 535.

In the pulse counting circuit unit 535, the signal pulses included in the pulse waveform signal input from the ringing pulse removal unit 534 are counted (subjected to pulse counting) in units of pixels all as the true signal pulses. Information on the signal pulses which have been counted in units of pixels by the pulse counting circuit unit 535 is sent to the image processing unit 205. In the image processing unit 205, the information on the signal pulses which have been output from the pulse counting circuit unit 535 and have been counted in units of pixels is converted into gradation values of the pixels and thereby image processing for generating an image is performed.

Each threshold value requested for performing processing in each unit of the pulse-count processing unit 53 is set via the control unit 210 in accordance with a result of image processing performed by the image processing unit 205. It is possible to display and confirm the result of image processing by the image processing unit 205 and a result of setting of each parameter by the control unit 210 on the GUI unit 215.

Even when the ringing phenomenon occurs in the photomultiplier of the detector 107 and/or the detection circuit, it becomes possible to observe the fine pattern with high resolution with no influence of the ringing phenomenon and it becomes also possible to improve the visibility of the bottom part of the deep-hole pattern by adopting the pulse counting system according to the first embodiment.

As described above, according to the first embodiment, by realizing the method for allowing discrimination and removal of the ringing pulse whose amplitude value and pulse width are hard to be distinguished from those of the true signal pulse and for detecting and counting the signal pulses with high accuracy, highly sensitive detection of the weak secondary electron signal caused by high resolution and high-speed scanning and proper brightness gradation setting of a detected image are made possible and contribute to improvement of resolution and throughput upgrading.

Second Embodiment

A second embodiment of the present invention will be described using FIG. 3 and FIG. 8. Since the configuration of the inspection-measurement apparatus of the scanning electron beam system according to the second embodiment is the same as that described in the first embodiment using FIG. 2 except for provision of a pulse-count processing unit 53b, description thereof is omitted.

In the first embodiment, when there exist two primary signal pulses B2 and B4 which are generated continuously with the undershoot pulse B6 being interposed, the primary signal pulse B4 which comes after the undershoot pulse B6 is discriminated as the ringing pulse.

However, there are cases where in the two primary signal pulses B2 and B4 which are generated continuously with the undershoot pulse B6 being interposed, the primary signal pulse B4 is not necessarily the ringing pulse. In this case, there is such a feature that a time taken until the primary signal pulse B4 is generated after generation of the undershoot pulse B6 is longer than a time taken until the undershoot pulse B6 is generated after generation of the primary signal pulse B2.

Accordingly, in the second embodiment, the pulse-count processing unit 53b is configured such that the time taken until the undershoot pulse B6 is generated after generation of the primary signal pulse B2 is compared with the time taken until the primary signal pulse B4 is generated after generation of the undershoot pulse B6 and the primary signal pulse B4 is discriminated as the ringing pulse only when a difference between the times is not more than a fixed value in order to prevent misdetection of the ringing pulse.

Figure 3:
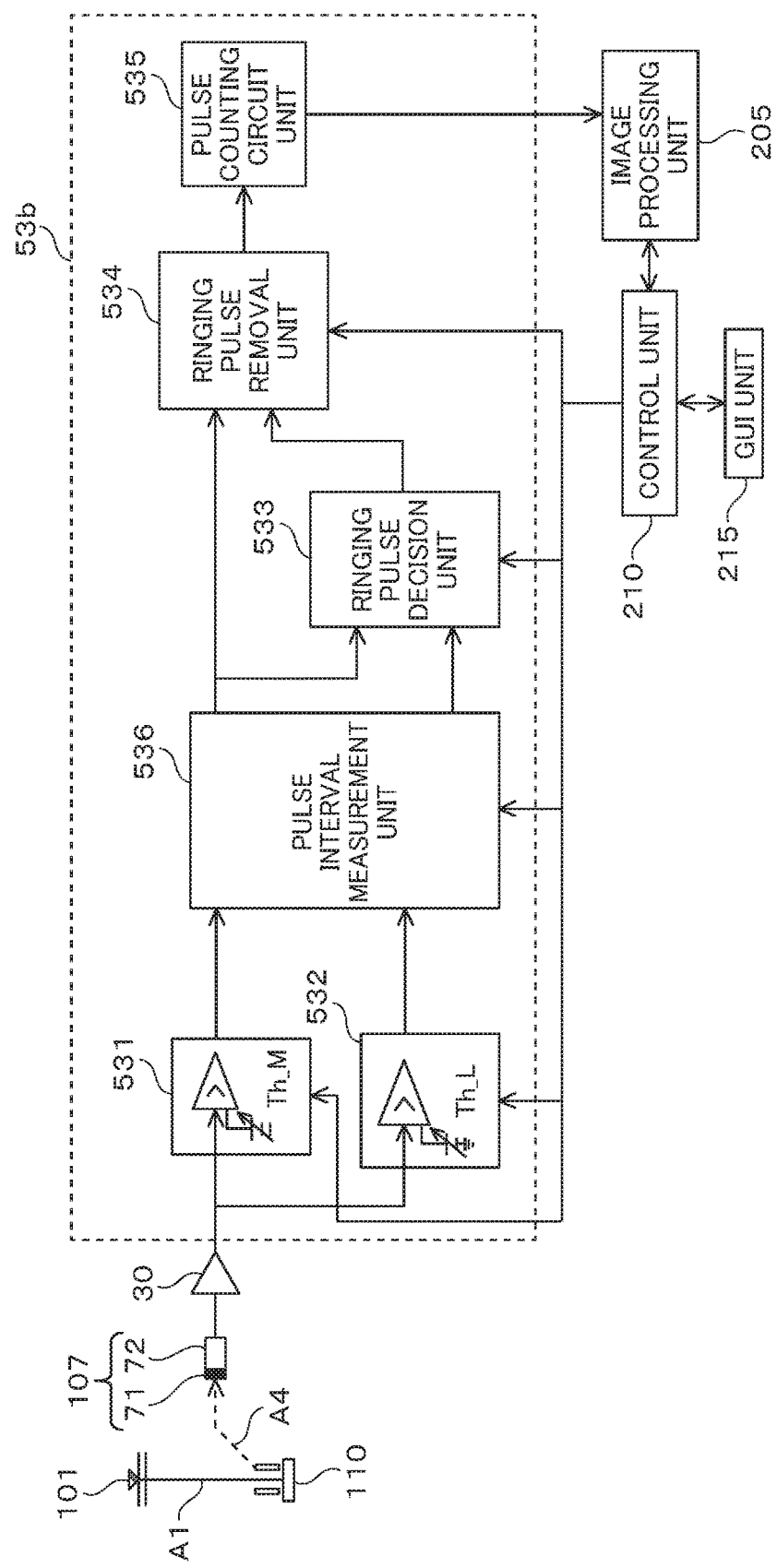
FIG. 3 is a block diagram illustrating one example of a configuration of a pulse-count processing unit of a measurement-observation-inspection apparatus using a scanning electron microscope according to a second embodiment of the present invention.

FIG. 3 illustrates one example of the configuration of the pulse-count processing unit 53b according to the second embodiment. The pulse-count processing unit 53b according to the second embodiment is different from the pulse-count processing unit 53 described in the first embodiment and illustrated in FIG. 1 in the point that a pulse interval measurement unit 536 which measures a time interval between the detected primary signal pulse and the undershoot pulse is installed behind the primary signal pulse detection unit 531 and the undershoot detection unit 532.

Figure 8:
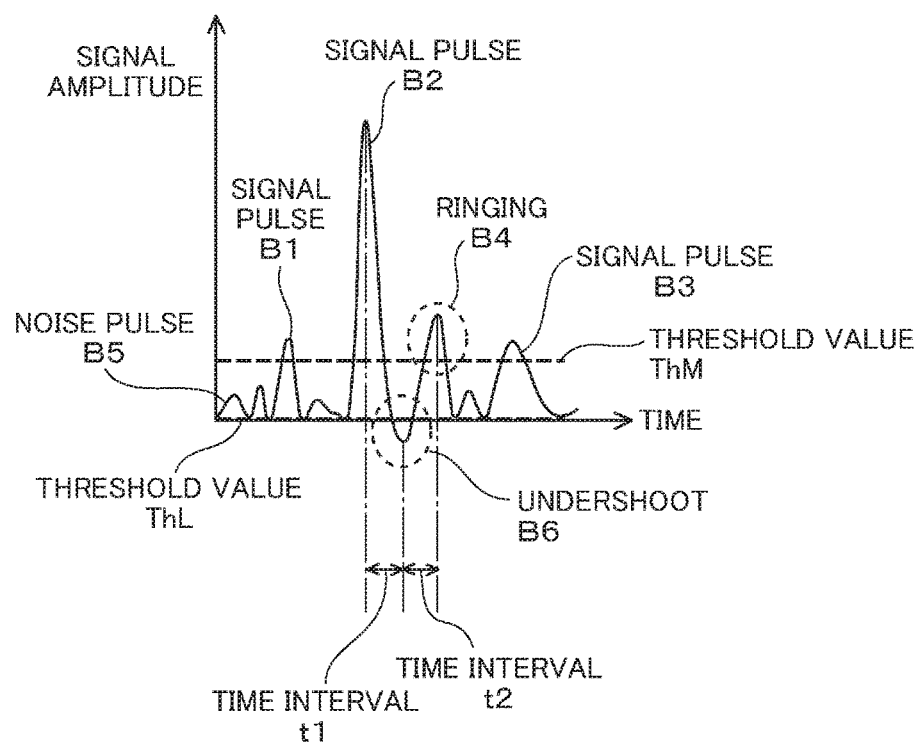
FIG. 8 is a waveform diagram illustrating one example of a relation among the signal pulse, the ringing pulse and an undershoot pulse.

FIG. 8 is a waveform chart which is the same as that described in the first embodiment and illustrated in FIG. 7 and the time interval t1 between the primary signal pulse B2 and the undershoot pulse B6 and the time interval t2 between the undershoot pulse B6 and the primary signal pulse B4 are additionally illustrated. The pulse interval measurement unit 536 measures the time interval t1 between the primary signal pulse B2 and the undershoot pulse B6 and the time interval t2 between the undershoot pulse B6 and the primary signal pulse B4.

When the difference between the time interval t1 between the primary signal pulse B2 and the undershoot pulse B6 and the time interval t2 between the undershoot pulse B6 and the primary signal pulse B4 which have been measured by the pulse interval measurement unit 536 is not more than a time difference which has been set in advance, the ringing pulse decision unit 533 decides the primary signal pulse B4 as the ringing pulse by using information on the undershoot pulse signal B6 and the two primary signal pulses B2 and B4 which are generated continuously with the undershoot pulse B6 being interposed. The decided ringing pulse B4 is removed by the ringing pulse removal unit 534.

In the pulse counting circuit unit 535, signal pulses included in the pulse waveform signal which has been input from the ringing pulse removal unit 534 with the ringing pulse being removed are all counted (subjected to pulse counting) as the true signal pulses in units of pixels. The information on the signal pulses which have been counted in units of pixels by the pulse counting circuit unit 535 is sent to the image processing unit 205. In the image processing unit 205, the information on the signal pulses which have been output from the pulse counting circuit unit 535 and have been counted in units of pixels is converted into the gradation values of the pixels and thereby image processing for generating the image is performed.

Each threshold value requested for performing processing in each unit of the pulse-count processing unit 53b is set via the control unit 210 in accordance with the result of image processing performed by the image processing unit 205. It is possible to display and confirm the result of image processing by the image processing unit 205 and the result of setting of each parameter by the control unit 210 on the GUI unit 215.

As described above, according to the second embodiment, by realizing the method for allowing discrimination and removal of the ringing pulse whose amplitude value and pulse width are hard to be distinguished from those of the true signal pulse and for detecting and counting the signal pulses with high accuracy, highly sensitive detection of the weak secondary electron signal caused by high resolution and high-speed scanning and proper brightness gradation setting of the detected image are made possible and contribute to improvement of resolution and throughout upgrading.

Third Embodiment

A third embodiment of the present invention will be described using FIG. 4 and FIG. 9.

Since the configuration of the inspection-measurement apparatus of the scanning electron beam system according to the third embodiment is the same as that described in the first embodiment using FIG. 2 except for provision of a pulse-count processing unit 53c, description thereof is omitted.

In the second embodiment, the time taken until the undershoot pulse B6 is generated after generation of the primary signal pulse B2 is compared with the time taken until the primary signal pulse B4 is generated after generation of the undershoot pulse B6 and the primary signal pulse B4 is discriminated as the ringing pulse only when the difference between the times is not more than the fixed value in order to prevent misdetection of the ringing pulse.

However, when a differential value between the times is detected so as to prevent misdetection of the ringing pulse, there occurs such a case that misdetection of the ringing pulse is not necessarily prevented solely on the basis of the information on the differential value between the times. That is, even when the signal level of the primary signal pulse B2 is low, there are cases where the undershoot pulse B6 is generated. In this case, there are also cases where the primary signal pulse B4 which is generated right after generation of the undershoot pulse B6 is not necessarily the ringing pulse and is the primary signal pulse.

Accordingly, in the third embodiment, the ringing pulse is discriminated by using information on a peak level of the primary signal pulse, in addition to the method for performing discrimination by using the differential value between the times which has been described in the second embodiment using FIG. 3 and FIG. 8.

Figure 4:
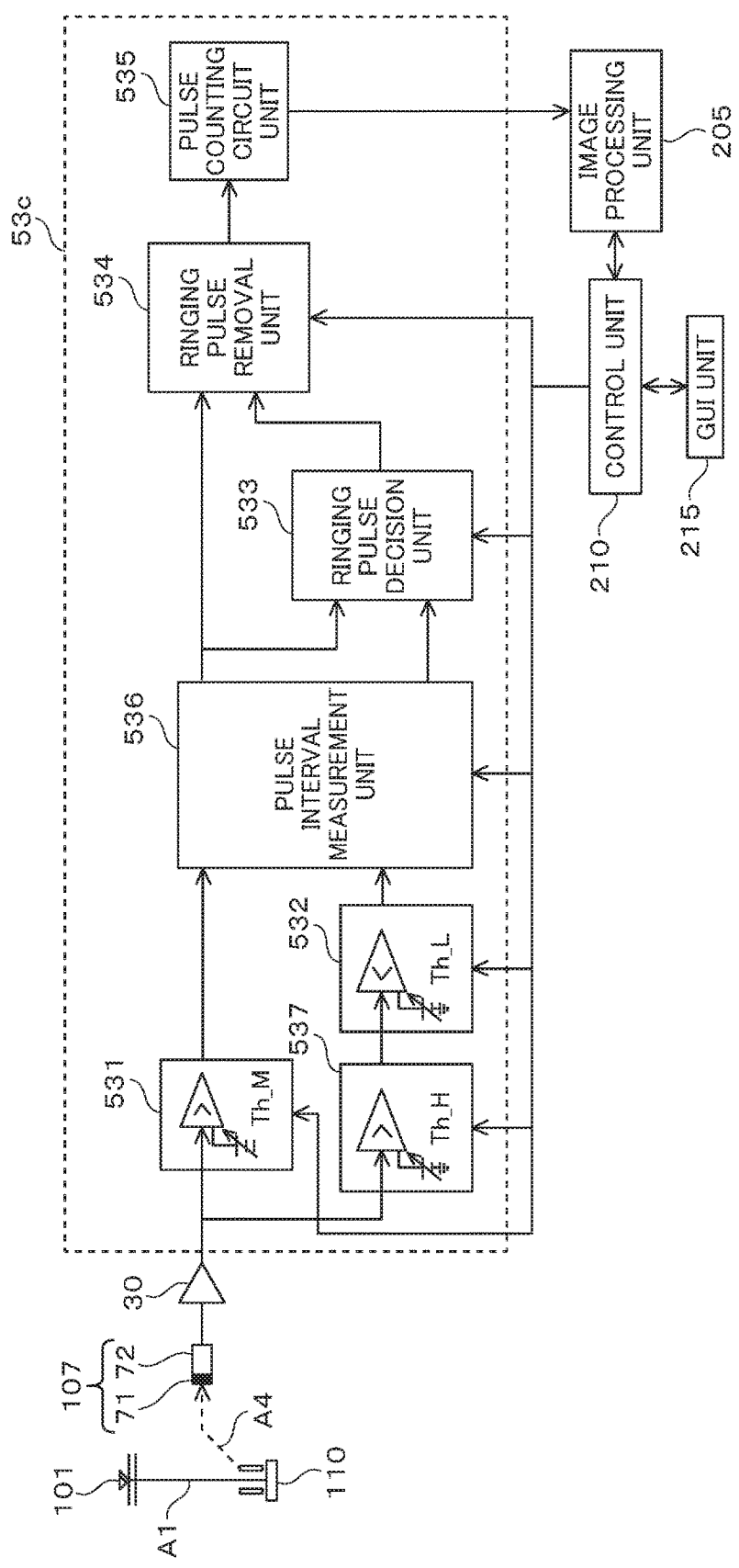
FIG. 4 is a block diagram illustrating one example of a configuration of a pulse-count processing unit of a measurement-observation-inspection apparatus using a scanning electron microscope according to a third embodiment of the present invention.

FIG. 4 illustrates one example of a configuration of the pulse-count processing unit 53c in the third embodiment. The pulse-count processing unit 53c in the third embodiment has a feature that a large amplitude signal pulse detection unit 537 which detects a large amplitude signal pulse of a value exceeding a threshold value ThH is installed before the undershoot detection unit 532 side by side with the primary signal pulse detection unit 531.

Figure 9:
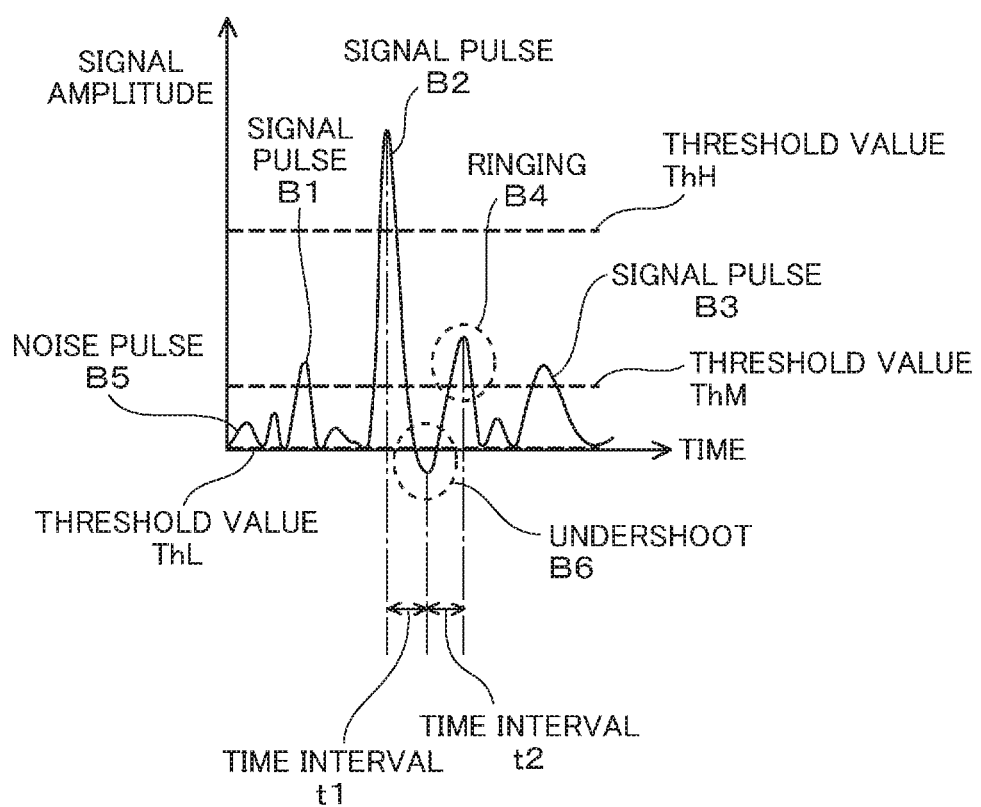
FIG. 9 is a waveform diagram illustrating one example of a method for discriminating and processing the signal pulse, the ringing pulse and the overshoot pulse by the measurement-observation-inspection apparatus using the scanning electron microscope according to one embodiment of the present invention.

A waveform chart illustrated in FIG. 9 pertaining to the third embodiment illustrates the same waveform as those in the waveform charts in FIG. 7 pertaining to the first embodiment and FIG. 8 pertaining to the second embodiment. In the third embodiment, as illustrated in FIG. 9, the threshold value ThH for the peak level of the signal pulse is set in addition to the threshold value ThM for signal pulse detection and the threshold value ThL for undershoot pulse detection.

That is, in the third embodiment, a signal pulse of a value exceeding the threshold value ThH is detected by utilizing a characteristic that the signal level (the signal intensity) of the signal pulse B2 at which the undershoot pulse B6 is generated is higher than the signal levels of the signal pulses B1 and B3 at which the undershoot pulse B6 is not generated. Then, decision as described in the second embodiment is performed on the undershoot pulse B6 which has been generated right after generation of the signal pulse as B2.

In the example illustrated in FIG. 4 and FIG. 9, the signal pulse of the value exceeding the threshold value ThH is detected by the large amplitude signal pulse detection unit 537 and the undershoot pulse B6 is detected by the undershoot detection unit 532 from the signal which has been input from the preamplifier circuit 30. Then, in the pulse interval measurement unit 536, the time intervals t1 and t2 are measured by using the information on the signal pulse B2 of the value exceeding the threshold value ThH detected by the large amplitude signal pulse detection unit 537, the undershoot pulse B6 detected by the undershoot detection unit 532 and the signal pulse detected by the primary signal pulse detection unit 531.

Then, in the ringing pulse decision unit 533, when the difference between the time interval t1 between the primary signal pulse B2 and the undershoot pulse B6 and the time interval t2 between the undershoot pulse B6 and the primary signal pulse B4 which has been measured by the pulse interval measurement unit 536 is not more than a time difference which has been set in advance, the primary signal pulse B4 is decided as the ringing pulse by using information on the undershoot pulse B6 and the two primary signal pulses B2 and B4 which are continuously generated with the undershoot pulse B6 being interposed.

The decided ringing pulse B4 is removed by the ringing pulse removal unit 534. The primary signal pulse B4 is decided as the ringing pulse in the two primary signal pulses B2 and B4 which are continuously generated with the undershoot pulse B6 being interposed. The decided ringing pulse B4 is removed by the ringing pulse removal unit 534.

In the pulse counting circuit unit 535, the signal pulses included in the pulse waveform signal which has been input from the ringing pulse removal unit 534 with the ringing pulse being removed are all counted (subjected to pulse counting) as the true signal pulses in units of pixels. The information on the signal pulses which have been counted in units of pixels by the pulse counting circuit unit 535 is sent to the image processing unit 205. In the image processing unit 205, the information on the signal pulses which have been output from the pulse counting circuit unit 535 and have been counted in units of pixels is converted into the gradation values of the pixels and thereby image processing for generating the image is performed.

Each threshold value requested for performing processing in each unit of the pulse-count processing unit 53b is set via the control unit 210 in accordance with the result of image processing performed by the image processing unit 205. It is possible to display and confirm the result of image processing by the image processing unit 205 and the result of setting of each parameter by the control unit 210 on the GUI unit 215.

As described above, according to the third embodiment, by realizing the method for allowing discrimination and removal of the ringing pulse whose amplitude value and pulse width are difficult to be distinguished from those of the true signal pulse and for detecting and counting the signal pulses with high accuracy, highly sensitive detection of the weak secondary electron signal caused by high resolution and high-speed scanning and proper brightness gradation setting of the detected image are made possible and contribute to improvement of resolution and throughout upgrading.

Fourth Embodiment

A fourth embodiment of the present invention will be described using FIG. 5.

Figure 5:
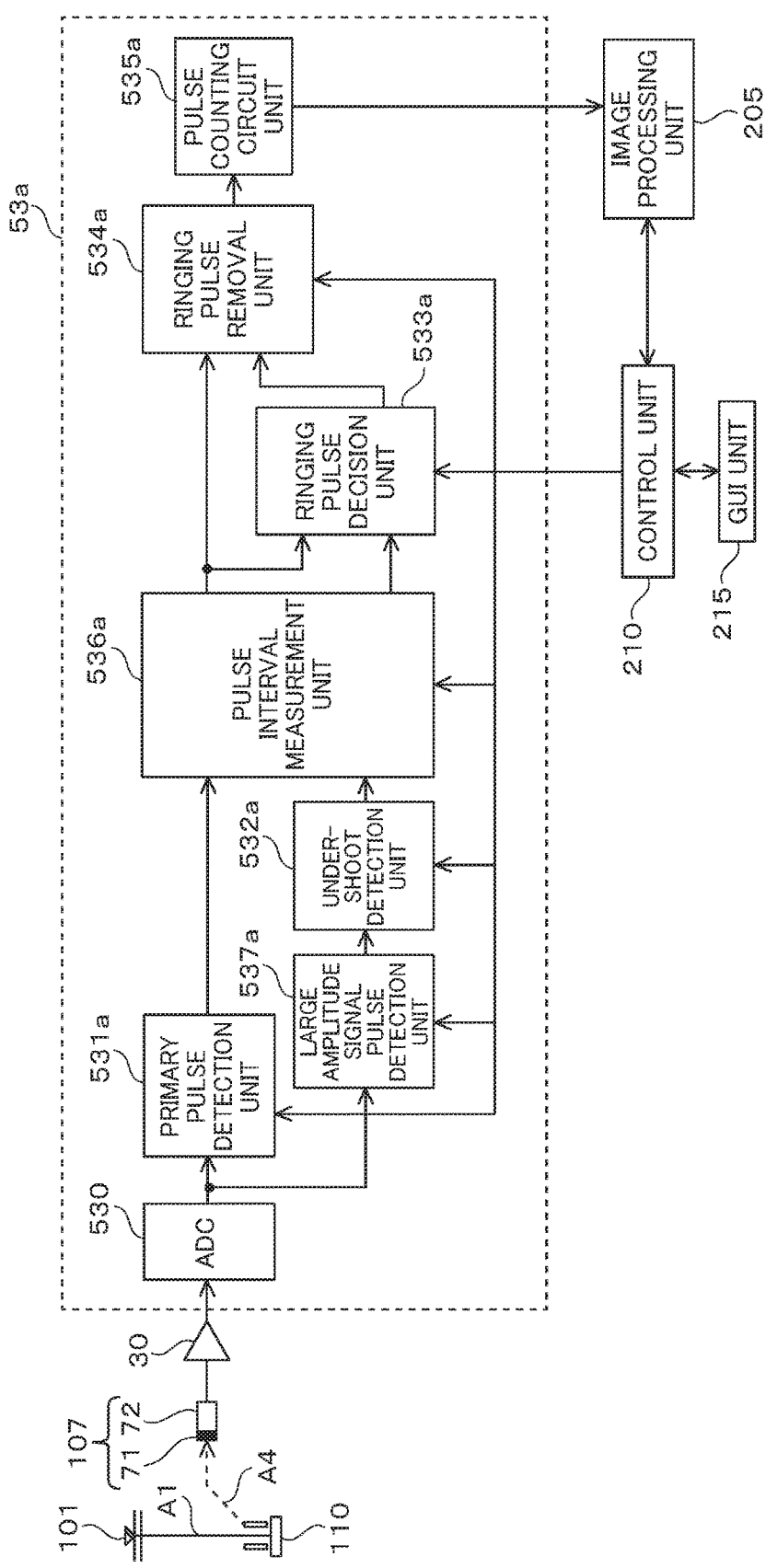
FIG. 5 is a block diagram block diagram illustrating one example of a configuration of a pulse-count processing unit of a measurement-observation-inspection apparatus using a scanning electron microscope according to a fourth embodiment of the present invention.

Although in the above-mentioned first, second and third embodiments of the present invention, the ringing pulse is discriminated and removed from the analog signal output from the preamplifier circuit 30 by using an analog circuit system, in the fourth embodiment illustrated in FIG. 5, at first, the analog signal output from the preamplifier circuit 30 is converted into a digital signal by an analog-to-digital converter 530.

Then, the digital signal is sequentially processed by a primary signal pulse detection unit 531a, a large amplitude signal pulse detection unit 537a, an undershoot detection unit 532a, a pulse interval measurement unit 536a, a ringing pulse detection unit 533a, a ringing pulse removal unit 543a, and a pulse count (counting circuit) unit 535a which are configured conforming to the configuration of the pulse-count processing unit 53c described in the third embodiment using FIG. 4 by digital circuit processing. In this case, the processing method for each functional block and the result of processing thereof are basically the same as those described in the third embodiment.

In addition, in the configuration of the fourth embodiment illustrated in FIG. 5, a pulse-count processing unit 53a may be configured so as to conform to the pulse-count processing unit 53b described in the second embodiment using FIG. 3 by deleting the large amplitude signal pulse detection unit 537a and/or so as to conform to the pulse-count processing unit 53 described in the first embodiment using FIG. 1 by further deleting the pulse interval measurement unit 536a.

As described above, according to the fourth embodiment, also in the digital system, by realizing the method for allowing discrimination and removal of the ringing pulse whose amplitude value and pulse width are hard to be distinguished from those of the true signal pulse and for detecting and counting the signal pulses with high accuracy, highly sensitive detection of the weak secondary electron signal caused by high resolution and high-speed scanning and proper brightness gradation setting of the detected image are made possible and contribute to improvement of resolution and throughout upgrading.

Although, as mentioned above, the invention which has been made by the inventors and others of the present application has been specifically described on the basis of the preferred embodiments thereof, it is needless to say that the present invention is not limited to the aforementioned embodiments and may be altered and modified in a variety of ways within a range not deviating from the gist thereof.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

The invention claimed is:

1. A charged particle beam apparatus comprising:
a charged particle optical system which scans a sample by irradiating the sample with a converged charged particle beam;
a secondary charged particle detection unit which detects secondary charged particles generated from the sample which has been scanned by being irradiated with the converged charged particle beam by the charged particle optical system;
a secondary electronic signal detection unit which receives and processes an output signal from the secondary charged particle detection unit which has detected the secondary charged particles by a detection unit included therein;
an image processing unit which receives the signal processed by the secondary electronic signal detection unit and generates an image of the sample; and
a control unit which controls operations of the charged particle optical system, the secondary charged particle detection unit, the secondary electronic signal detection unit and the image processing unit, wherein
the secondary electronic signal detection unit includes an analog processing unit which analogically processes the output signal received from the secondary charged particle detection unit and a pulse-count processing unit which counts and processes pulses of the output signal received from the secondary charged particle detection unit, and
the pulse-count processing unit includes a ringing pulse removal unit which removes a ringing pulse included in the output signal received from the secondary charged particle detection unit and a pulse-counting unit which counts the pulses of the signal from which the ringing pulse has been removed by the ringing pulse removal unit.

2. The charged particle beam apparatus according to claim 1, wherein
the pulse-count processing unit further includes a ringing pulse decision unit which decides the ringing pulse by detecting an undershoot pulse included in the output signal from the secondary charged particle detection unit, and the ringing pulse removal unit removes the ringing pulse included in the output signal from the secondary charged particle detection unit on the basis of information that the ringing pulse has been decided by the ringing pulse decision unit.

3. The charged particle beam apparatus according to claim 2, wherein
the pulse-count processing unit further includes a pulse interval measurement unit which detects the undershoot pulse included in the output signal received from the secondary charged particle detection unit and measures pulse intervals between the undershoot pulse and a signal pulse which is present right before the undershoot pulse and between the undershoot pulse and a signal pulse which is present right after the undershoot pulse, and the ringing pulse decision unit decides the ringing pulse by using information on the pulse intervals measured by the pulse interval measurement unit.

4. The charged particle beam apparatus according to claim 3, wherein
the pulse-count processing unit further includes a large amplitude signal pulse detection unit which detects a signal pulse of a value exceeding a threshold value which has been set in advance in the output signal received from the secondary charged particle detection unit, and the pulse interval measurement unit measures the pulse intervals in regard to a signal pulse which has been detected by the large amplitude signal pulse detection unit and the value of which has exceeded the threshold value which has been set in advance and a ringing pulse and a signal pulse which have been generated right after generation of the signal pulse exceeding the threshold value.

5. The charged particle beam apparatus according to claim 1, wherein
the pulse-count processing unit further includes an analog-to-digital conversion unit which converts an analog output signal output from the secondary charged particle detection unit into a digital signal, and the ringing pulse removal unit processes the signal which has been converted into the digital signal by the analog-to-digital conversion unit.

6. An image forming method of charged particle beam apparatus comprising:
scanning a sample by irradiating the sample with a converged charged particle beam and thereby detecting secondary charged particles generated from the sample by a detection unit;
receiving and processing an output signal from the detection unit which has detected the secondary charged particles; and
receiving the processed signal and forming an image of the sample, wherein
receiving and processing the output signal from the detection unit are performed by analogically processing the output signal received from the detection unit by an analog processing unit and by performing pulse-count processing of processing the output signal received from the detection unit by counting pulses in the output signal, and
performing the pulse-count processing means to perform pulse-count processing by removing a ringing pulse included in the output signal received from the detection unit and counting pulses in the signal from which the ringing pulse has been removed.

7. The image forming method of charged particle beam apparatus according to claim 6, wherein
the pulse-count processing is performed by detecting an undershoot pulse included in the output signal received from the detection unit and deciding the ringing pulse, removing the ringing pulse included the output signal received from the detection unit on the basis of information that the ringing pulse has been decided, and preforming processing by using the signal from which the ringing pulse has been removed.

8. The image forming method of charged particle beam apparatus according to claim 7, wherein
the pulse-count processing is performed by detecting the undershoot pulse included in the output signal received from the detection unit and measuring pulse intervals between the undershoot pulse and a signal pulse which is present right before the undershoot pulse and between the undershoot pulse and a signal pulse which is present right after the undershoot pulse, and on the basis of information that the ringing pulse has been decided using information on the measured pulse intervals.

9. The image forming method of charged particle beam apparatus according to claim 8, wherein
the pulse-count processing is performed by detecting a signal pulse of a value exceeding a threshold value which has been set in advance in the output signal received from the detection unit and measuring pulse intervals in regard to the detected signal pulse of the value exceeding the threshold value which has been set in advance, and a ringing pulse and a signal pulse which have been generated right after generation of the signal pulse exceeding the threshold value, and on the basis of information that the ringing pulse has been decided by using information on the measured pulse intervals.

10. The image forming method of charged particle beam apparatus according to claim 6, wherein
the pulse-count processing is performed by converting an analog output signal which has been output from the detection unit into a digital signal, and removing the ringing pulse is performed by processing the signal which has been converted into the digital signal.

* * * * *